United States Patent
Madeira et al.

(10) Patent No.: US 9,327,416 B2
(45) Date of Patent: May 3, 2016

(54) ATOMIC LAYER DEPOSITION COATINGS ON RAZOR COMPONENTS

(75) Inventors: John Madeira, Assonet, MA (US); Neville Sonnenberg, Newton, MA (US)

(73) Assignee: The Gillette Company, Boston, MA (US)

( * ) Notice: Subject to any disclaimer, the term of this patent is extended or adjusted under 35 U.S.C. 154(b) by 1928 days.

(21) Appl. No.: 12/504,991

(22) Filed: Jul. 17, 2009

(65) Prior Publication Data

US 2011/0010950 A1    Jan. 20, 2011

(51) Int. Cl.
  *C25F 3/00*    (2006.01)
  *B26B 21/60*   (2006.01)
  *C23C 16/01*   (2006.01)
  *C23C 16/455*  (2006.01)
  *C23C 16/00*   (2006.01)

(52) U.S. Cl.
  CPC .............. *B26B 21/60* (2013.01); *C23C 16/006* (2013.01); *C23C 16/01* (2013.01); *C23C 16/45525* (2013.01); *C23C 16/45555* (2013.01)

(58) Field of Classification Search
  CPC  B26B 21/60; C23C 16/45555; C23C 16/006; C23C 16/45525; C23C 16/01
  USPC ...................... 216/11, 66; 30/34.05
  See application file for complete search history.

(56) References Cited

U.S. PATENT DOCUMENTS

| | | | |
|---|---|---|---|
| 3,911,579 A * | 10/1975 | Lane et al. | 30/346.54 |
| 4,058,430 A | 11/1977 | Suntola et al. | |
| 5,048,191 A | 9/1991 | Hahn | |
| 5,056,227 A | 10/1991 | Kramer | |
| 6,468,642 B1 | 10/2002 | Bray et al. | |
| 6,684,513 B1 | 2/2004 | Clipstone et al. | |
| 6,720,259 B2 * | 4/2004 | Londergan et al. | 438/680 |
| 2004/0177516 A1 * | 9/2004 | Teeuw et al. | 30/346.55 |
| 2005/0028389 A1 * | 2/2005 | Wort et al. | 30/346.54 |
| 2005/0268470 A1 | 12/2005 | Skrobis et al. | |
| 2006/0000411 A1 * | 1/2006 | Seo et al. | 118/715 |
| 2007/0227008 A1 | 10/2007 | Zhuk et al. | |
| 2008/0073127 A1 * | 3/2008 | Zhan et al. | 175/434 |

OTHER PUBLICATIONS

Mikko Ritala and Markku Leskelä, "Atomic Layer Deposition," in *Handbook of Thin Films Materials*, H. S. Nalwa, Ed., vol. 1, Chapter 2, pp. 103-159, Academic Press, 2002.
John A. Thornton, "High Rate Think Film Growth," Ann. Rev. Matter. Sci 7:239-260, Annual Reviews Inc. (1977).

* cited by examiner

*Primary Examiner* — Binh X Tran
(74) *Attorney, Agent, or Firm* — Joanne N. Pappas; Kevin C. Johnson; Steven W. Miller (57) ABSTRACT

A novel application of the atomic layer deposition (ALD) process for producing a conformal coating on a razor blade is disclosed where a uniform, conformal, dense coating is deposited on an entire surface of a blade flank and at least a portion or an entire surface of a blade body. To improve the shaving ability of the coated blade edge (e.g., decrease the blade tip radius), the ALD-produced coating may be etched during, after, or both during and after, the ALD process.

17 Claims, 10 Drawing Sheets

ATOMIC LAYER DEPOSITION COATINGS ON RAZOR COMPONENTS

FIELD OF THE INVENTION

This invention relates to coating components, and more particularly to improved coatings on razor components, such as razor blades.

BACKGROUND OF THE INVENTION

Most razor blades on the market are produced by applying thin film hard coatings to sharpened stainless steel substrates. These coatings are typically deposited on blade edges by Physical Vapor Deposition (PVD) techniques which include vacuum conditions where raw materials, referred to as target materials, i.e., the material that is going to be deposited, are generally in solid form. Common PVD techniques incorporate processes such as sputter coating or Pulsed Laser Deposition (PLD).

Thin hard coatings have certain roles and advantages. One advantage is that the hard coatings generally strengthen blade edges, particularly those with slim profiles, by providing reinforcement to the edges, thus protecting the edges from excessive damage during shaving.

Additionally, the PVD-formed coating generally adheres well to the surface of the blade edge, in turn providing an adequate surface for subsequent depositions of coatings (e.g., Teflon® or telomer coatings or other polymeric material coatings).

However, a major disadvantage of the current PVD processes is that the PVD processes are predominantly "line of sight" processes, such that the best quality coatings are deposited on flat surfaces or components. With PVD processes, in order to get optimal coverage over three dimensional shaped components, the components are typically rotated and planetated in the vacuum chamber. While these additional steps of rotating and planetating assist in producing more uniform coverage, the quality of the coatings produced is compromised since, as known in the art, coating density degrades fairly rapidly with an angle of incidence and since the PVD process is, by its nature of deposition, known to yield a film or coating with columnar growth. A general description of such columnar growth of films may be found in J. A. Thornton, Ann. Rev. Mater. Sci 7, 239 (1977), entitled "High Rate Thick Film Growth."

PVD-formed coatings are capable of being shaped simultaneously with deposition in that there is no need to stop the deposition process so as to allow the ultimate tip of the blade edge or the blade tip to be formed optimally for cutting hair without cutting or nicking the skin. Thus, to increase the density and limit the film columnar growth, oftentimes current PVD sputtered films or coatings are deposited with high bias, optimizing the mechanical properties of the thin film. However, a disadvantage of high bias is that it may cause the ultimate blade tip to end up being too sharp (e.g., in that there is little to no coating in the blade tip area), posing a limitation in obtaining an optimum tip radius which is desirable, as will be described below.

Consequently, uniformly coating razor blade edges has become challenging in the prior art. With an angle of incidence oftentimes being small (e.g., 15 degrees or less), even with an applied high bias, the prior art coatings on blade edges are generally still columnar with low density having compromised mechanical properties and film roughness.

Furthermore, an inherent problem of depositing coatings using vacuum techniques in general is that the coatings on the blade edges may produce a blade tip radius value which may be too great for a shave-able blade edge and may have undesirably high wool felt cutter forces (e.g., the lowest cutting force obtained from cutting the wool felt is high). In general, cutter forces are measured by the wool felt cutter test, which measures the cutter forces of the blade by measuring the force required by each blade to cut through wool felt. Each blade is run through the wool felt cutter a certain number of times (e.g., 5) and the force of each cut is measured on a recorder. The lowest value is defined as the cutter force.

For a blade edge to effectively shave hair (e.g., shaving ability or shave-ability) it is generally known that the wool felt cutter forces advantageously may need to be less than about 1.6 lbs coinciding with a blade tip radius value of about 20 nm. A description of wool felt cutter forces and blade tip radius may be found in US Patent Publication No. 2007/0227008, entitled "Razors" published on Oct. 4, 2007, U.S. Pat. No. 5,056,227, entitled "Razor Blade Technology" issued on Oct. 15, 1991, and in U.S. Pat. No. 5,048,191, entitled "Razor Blade Technology" issued on Sep. 17, 1991, the aforementioned assigned to the assignee hereof.

Additionally, the known prior art processes, such as PVD, are generally limited to coating no more than an upper portion of the blade flanks and generally not covering the entire blade flank. In addition, the deposited coating thickness decreases the further away from the ultimate tip (e.g., closer to the blade body) such that the thickness may generally be close to zero towards the end of the blade flank.

It may however be desirable to utilize the one process at one time to not only coat a portion of a blade flank but to uniformly coat an entire blade flank and also a portion(s) or the entire blade body as well, where a razor blade generally has a blade body and two blade flanks.

Hence, there is a need to better develop the process of coating razor blades to improve the quality (e.g., uniformity and denseness) and coverage of the coating while maintaining shave-ability.

SUMMARY OF THE INVENTION

The present invention provides a method for coating a razor blade including depositing, on at least one razor blade positioned in a vacuum chamber, at least one coating of at least one material, using an atomic layer deposition (ALD) process wherein the at least one coating covers an entire surface of at least one blade flank and at least a portion of a surface of a blade body of the at least one razor blade, and etching the at least one coating. The etching may occur during, after, or both during and after the ALD process.

In another aspect of the present invention, a razor blade including at least one coating of at least one layer of material formed using an ALD process and wherein one of the at least one coatings is etched.

In yet another aspect of the present invention, a razor blade comprising a first coating of a first material and a second coating of a second material, at least one of the first and second coatings deposited using an ALD process wherein the second coating is deposited on a top surface of the first coating.

Still further aspects of the invention provide a method for coating a razor component by depositing, on at least one razor component, positioned in a vacuum chamber, at least one coating of at least one material using an ALD process. Razor components may be include cartridge clips, blade supports, razor blade bodies, razor blade flanks, bent blades, razor handles, or any combination thereof.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

Other features and advantages of the invention will be apparent from the following detailed description, and from the claims.

BRIEF DESCRIPTION OF THE DRAWINGS

While the specification concludes with claims particularly pointing out and distinctly claiming the subject matter which is regarded as forming the present invention, it is believed that the invention will be better understood from the following description which is taken in conjunction with the accompanying drawings in which like designations are used to designate substantially identical elements, and in which:

DETAILED DESCRIPTION OF THE INVENTION

The invention discloses a novel application of the atomic layer deposition (ALD) process for coating razor blade bodies and flanks.

ALD is generally known in the art as a self-limiting, sequential surface chemistry that deposits conformal thin films of materials onto substrates of varying compositions. ALD is similar in chemistry to Chemical Vapor Deposition (CVD), except that the ALD reaction breaks the CVD reaction into two half-reactions, keeping the precursor materials separate during the reaction. Since ALD film "growth" is self-limited and based on surface reactions, achieving atomic scale deposition and in turn the ability to control the deposition is possible. Further, by keeping the precursors separate throughout the coating process, atomic layer control of film grown may be obtained as fine as about 0.1 nanometer (nm) per monolayer.

ALD processes and characteristics are generally described for instance, in U.S. Pat. No. 4,058,430, issued Nov. 15, 1977, entitled "Method for Producing Compound Thin Films" and in M. Ritala and M. Leskelä, "Atomic layer deposition," in *Handbook of Thin Films Materials*, H. S. Nalwa, Ed., vol. 1, chapter 2, pp. 103-159, Academic Press, 2002. In the prior art applications, the ALD deposition generally occurs onto flat surfaces into trenches.

In the instant invention, the ALD deposition occurs onto a cutting edge in the flank of a razor blade at the point of intersection of oblique angles and onto the blade body. ALD provides a number of advantages, as described below, when utilized in the novel application of coating components of razor systems such as razor blades in accordance with the present invention.

One key advantage of ALD is that it is generally possible to coat an exposed surface of a substrate uniformly, a single atomic layer at a time, and since it is not a "line-of-sight" technique as the prior art PVD process, ALD is capable of coating surfaces regardless of their shape(s), structure or position. Thus, when the ALD process is used for coating razor blades, the entire bevel of the blade flank and any exposed portions of the blade body may be uniformly coated one monolayer at a time. Since it deposits or produces one monolayer at a time, coatings or films with optimum density may be achieved. It is generally known that denser films or coatings are advantageous because they are less apt to corrode and have better wear-resistance.

The following terms may be defined as indicated below in accordance with the present invention.

The term "monolayer" in the present invention signifies one layer or an "atomic" or one-layered material. Several monolayers disposed on top of each other may signify a "coating" or a "film."

Thus, the terms "film" and "coating" may be used interchangeably in the present invention, both terms generally signifying the deposited material.

The term "adsorbed layer" signifies a layer formed in the ALD process after a first precursor is introduced into a vacuum chamber and deposited. The adsorbed layer is gathered on the surface of a substrate (e.g., the stainless steel material of a razor blade) via accumulation of gases, liquids, or solutes as a condensed layer.

A "dense" material is a material characterized as being "closest-packed" or having substantially zero porosity. "Closest-packed" signifies a formation of atomic layers of molecules or elements of material that are nested compactly (adjacent to and on top of each other) such that substantially no pores or apertures are formed in between the molecules and generally no molecular columns (e.g., non-columnar) are formed. For instance, in FIG. 6, coating 62 is depicted as being "closest-packed" or "dense." Generally, the "density" of a coating may be inversely proportional to the porosity (e.g., the higher the density, the lower the porosity).

A "uniform" material is a material having substantially identical unvarying characteristics or degrees thereof throughout. For instance, a deposited material comprising a uniform thickness may signify a material with substantially the same thickness throughout the deposited area.

A "smooth" surface refers to a surface generally free from projections or unevenness, and not rough.

A "thin" coating or material may have a thickness ranging from about 2 nm to about to about 500 nm and desirably about 5 nm.

"Homogenous" coatings or materials have thicknesses below 2 nm. The ALD process of the present invention is capable of depositing both thin and homogenous coatings.

"Conformal" (e.g., a "conformal" coating) signifies the covering of a whole area of a component such that all surfaces are covered regardless of the shape, structure or angle or placement of the component (e.g., in a vacuum chamber). Notably, since the nature of deposition of the ALD process provides conformal coatings, the ALD process in the present invention desirably requires no rotating or planetating of the components.

The term "razor blade" in the present invention desirably signifies a "substrate" comprised of stainless steel which includes a blade body and at least one flank. Desirably, a razor blade includes two flanks forming a blade edge and a blade body. The two flanks intersect at a point or tip, or what is oftentimes referred to as the ultimate tip. Each flank may have one, two or more bevels. The blade body is generally the remaining area of the razor blade beneath the flanks or bevels. As shown in a call-out section of FIG. 1, blade 12 includes blade body 21, two bevels 26 for each of two flanks 24 which intersect at tip 23 forming an edge 25. A "substrate" signifies the substance or material acted upon by the ALD process in the present invention. It is contemplated that the substrate of the present invention may also be comprised of other metals, plastic, paper, or any other substance. Illustrative embodiments herein relate to a stainless steel substrate commonly used for razor blade formation.

"Blade tip radius" (oftentimes referred to as the "ultimate tip radius") signifies a radius measurement taken in the circular area of the ultimate tip of the razor blade proximal to the location where the two flanks intersect and may be measured on a razor blade whether the blade is coated or not. A description of blade tip radius, as generally known in the art, is found in U.S. Pat. No. 5,048,191, entitled "Razor Blade Technology" issued on Sep. 17, 1991, and U.S. Pat. No. 5,056,227, entitled "Razor Blade Technology" issued on Oct. 15, 1991, the aforementioned assigned to the assignee hereof.

FIGS. 1-7 show an illustrative example of an Atomic Layer Deposition (ALD) process for depositing a Zirconium Oxide or $ZrO_2$ coating onto a stainless steel razor blade substrate is provided in accordance with the present invention.

Figure 1:
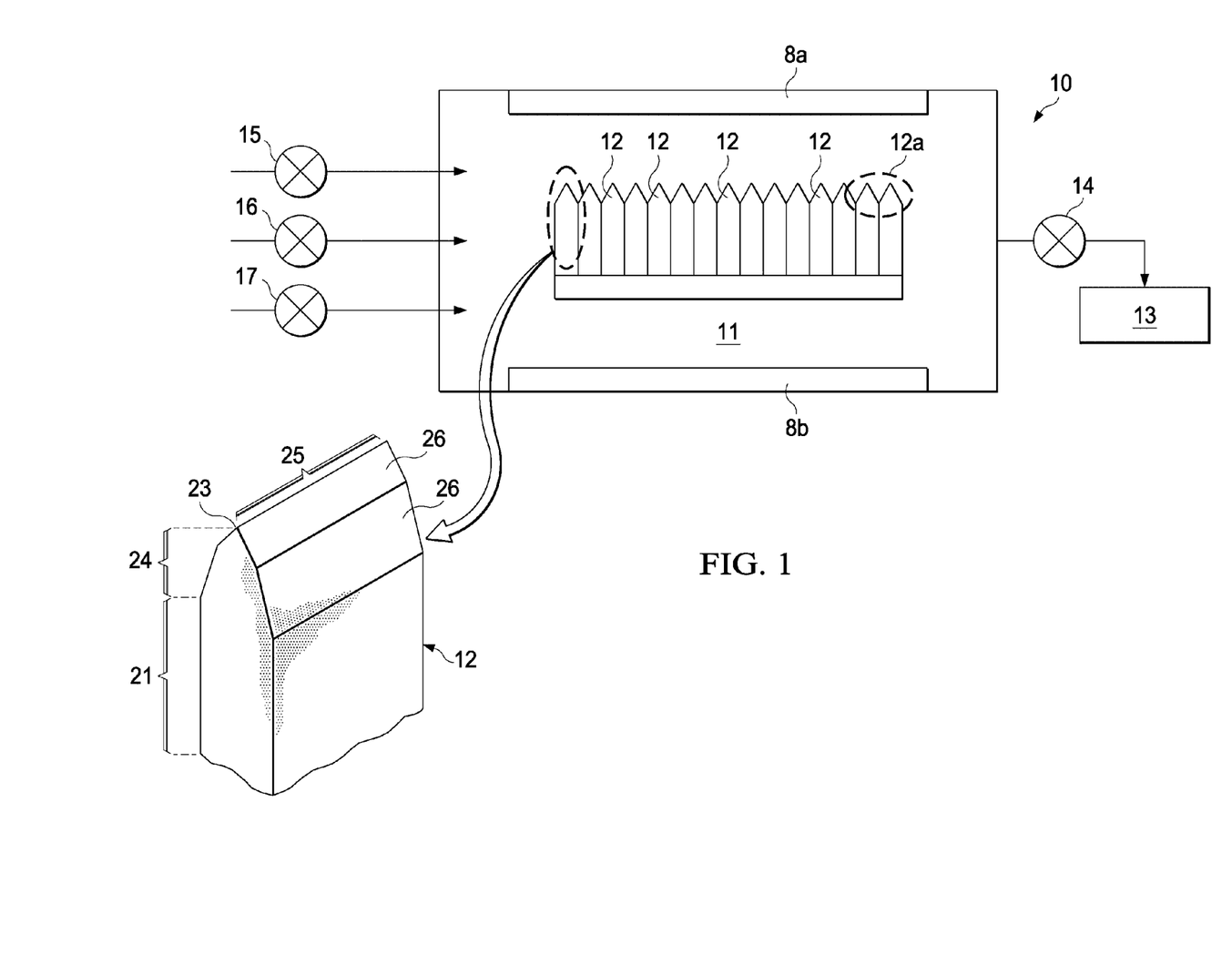
FIGS. 1 and 1A are schematics of a vacuum chamber showing razor blades capable of being coated via atomic layer deposition (ALD) in accordance with the present invention.
Figure 1A:
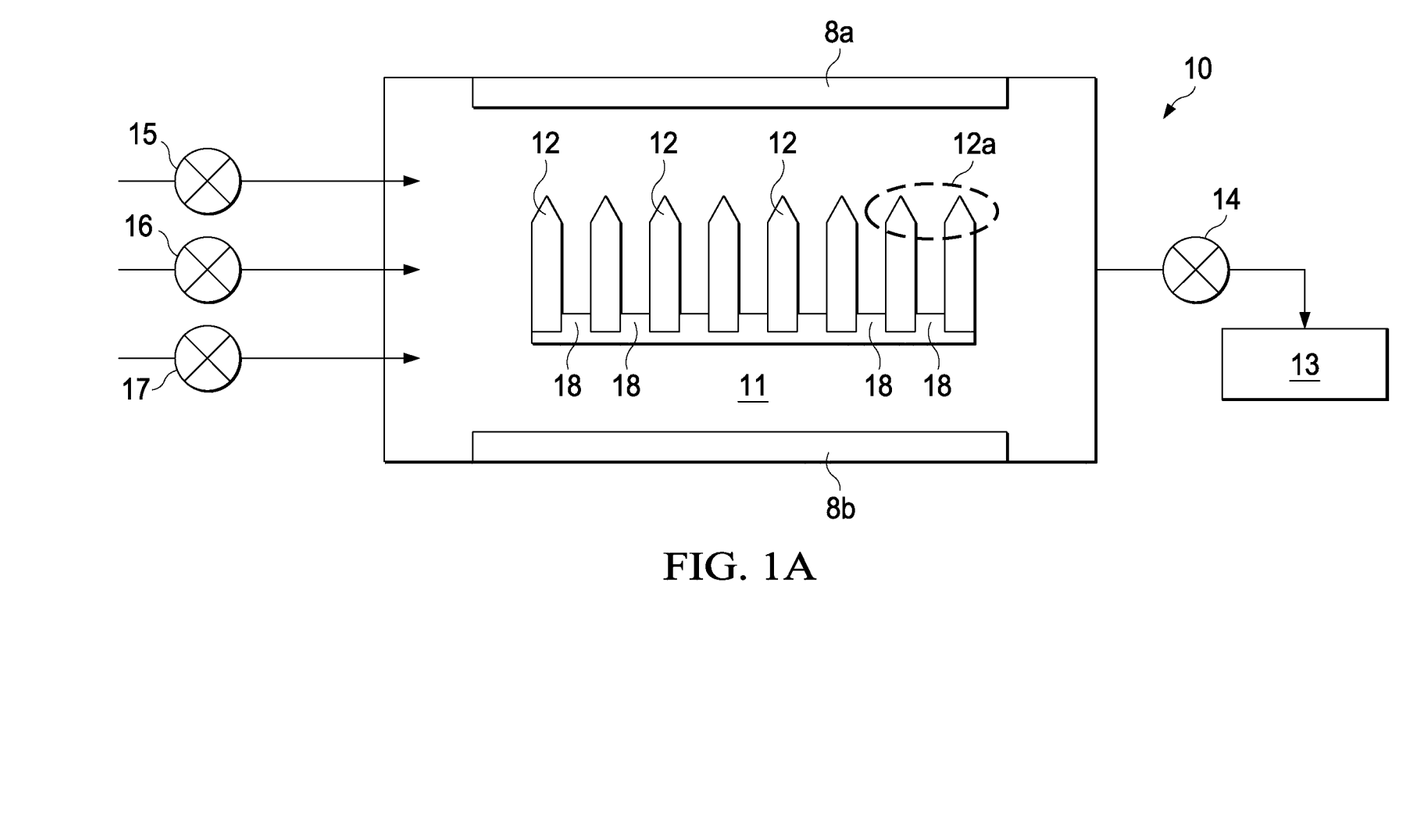

Referring now to FIG. 1, a block diagram of a vacuum chamber system 10 is depicted having a plurality of razor blades 12 positioned within a vacuum chamber 11. Razor blades 12 generally have a blade body 21, blade tips 23 and blade edges 24. The razor blades 12 may be arranged in any manner within the chamber. As shown, the razor blades are positioned adjacent to each other in an arrangement often times referred to as a razor blade spindle. They may also, however, be disposed with a space in between each other (as shown in FIG. 1A) using spacers 18. By using spacers 18, coating coverage onto the blade bodies 21 of the blades 12 is increased.

The blades 12 may also be disposed with the edges and tips facing in opposite directions or at different angles from each other (not shown). Any feasible orientation of blades 12 is contemplated in the present invention.

In preparation for the ALD process, the vacuum chamber 11 is desirably initially evacuated (or purged of all chemicals or gases) through valve 14 using a vacuum pump 13. Heaters 8a and 8b are then turned on and may be set between an ambient or room temperature (20 to 25° C.) to about 500° C. and desirably set between about 150° C. to about 400° C. Throughout the ALD process described herein, the pressure conditions inside vacuum chamber 11 may range from about 0.01 Torr to about 3.0 Torr and may desirably be about 1 Torr.

Figure 2:
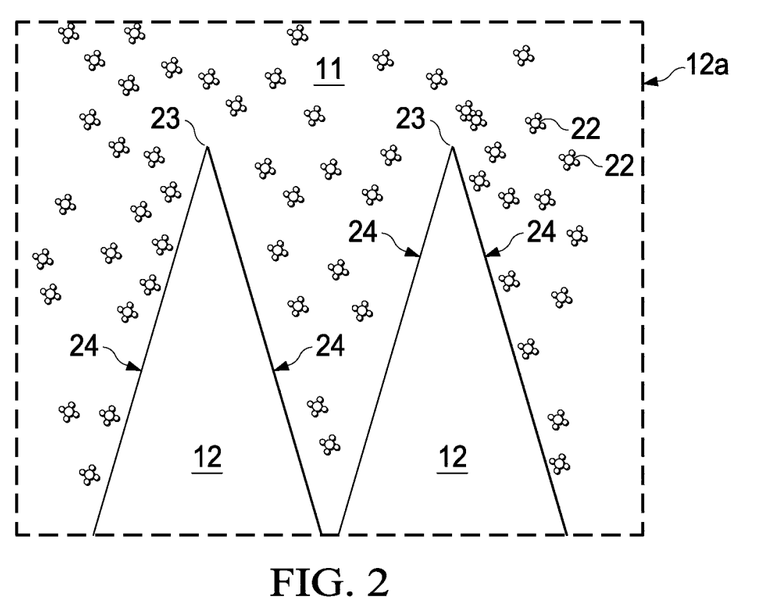
FIG. 2 is a close-up schematic of FIG. 1 showing a cross-section of a portion of two razor blade edges after a first precursor is introduced into the vacuum chamber.

At about this time, as shown in FIG. 2, a first deposition precursor 22 is introduced into the vacuum chamber 11 through input valve 15. In this example, the first precursor 22 is Zirconium Chloride ($ZrCl_4$) in vapor form. FIG. 2 depicts blade tip cross-section 12a of FIG. 1 showing a close-up view of two blade tip areas having tips 23 and flanks 24 and $ZrCl_4$ gas molecules 22 floating in the chamber 11.

Figure 3:
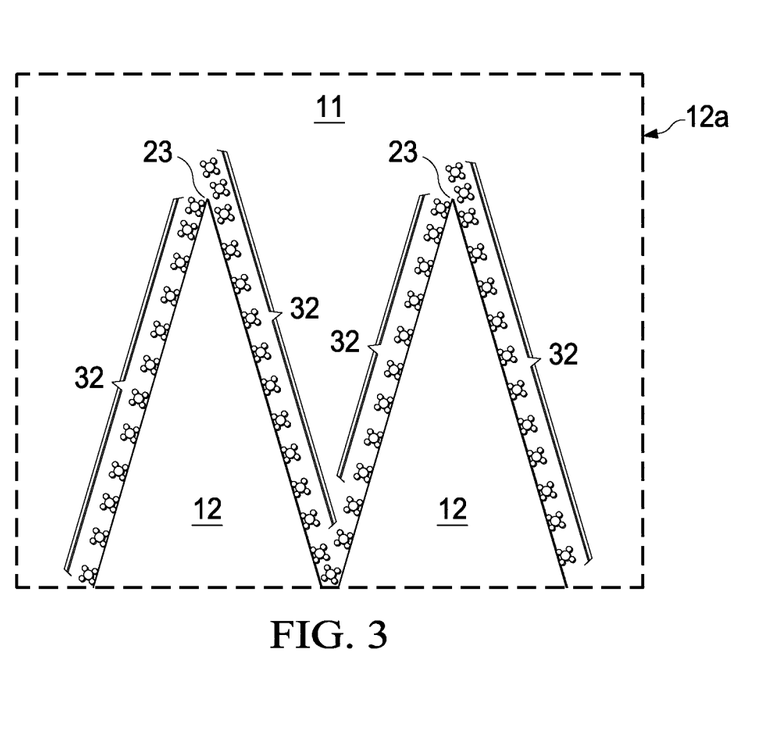
FIG. 3 is a close-up schematic of FIG. 2 after a first precursor forms a surface monolayer of material on the razor blade edges.

Subsequently, the first deposition precursor 22 or $ZrCl_4$ vapor then forms an adsorbed layer 32 of material on blade flanks 24 as shown in FIG. 3 in chamber 11. The layer 32 is considered adsorbed since it is a condensed layer having gathered on the surface of the blade flanks 24 from the vapor 22 in the chamber 11.

It should be noted that, though only the blade flanks 24 and blade tips 23 are shown in the close-up view of FIGS. 2 and 3, any exposed surface of the blades 12 including the blade body 21 and flanks 24 within the vacuum conditions will be wholly and conformally coated in the present invention process. This is shown, for instance, in FIG. 6 where a blade flank 24 is conformally covered by a coating and in FIG. 10 where blade body 121 and blade flank 124 are conformally coated.

First vacuum conditions achieved as indicated above with respect to temperature and atmospheric pressure are effective to allow the formation of the adsorbed layer 32. The adsorbed layer 32 may range in thickness from about 0.1 nm to about 0.3 nm and as shown in FIG. 3, adsorbed layer 32 may desirably have a fairly uniform thickness throughout.

The vacuum chamber 11 is then purged of the first deposition precursor 22 or $ZrCl_4$ vapor remaining in the chamber 11 by the introduction of an inert gas, desirably Argon or Nitrogen gas, through input valve 16 thereby providing second vacuum conditions effective for allowing a second deposition precursor to be introduced into the chamber to form another monolayer of material as will be described below.

Figure 4:
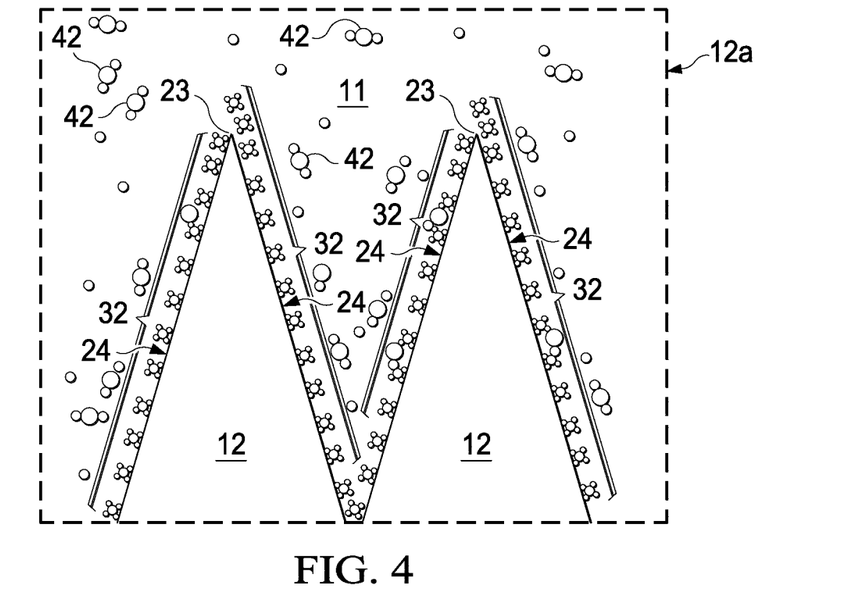
FIG. 4 is a close-up schematic of FIG. 3 after a second precursor is introduced into the vacuum chamber.

As shown in FIG. 4, a close-up view of blade flanks 24 previously coated with the adsorbed layer 32 of material and in accordance with the present invention, a second deposition precursor 42 is then introduced into the chamber through input valve 17. In this embodiment, a second deposition precursor 42 is desirably "water" existing as a gas (e.g., $H_2O$ gas) which may also be referred to as "water vapor." FIG. 4 illustrates the second deposition precursor 42 just after its introduction into chamber 11 and is represented by elements floating in the chamber 11. As before, the entire blade 12 including blade body 21, though not shown, succumbs to the chamber conditions.

Figure 5:
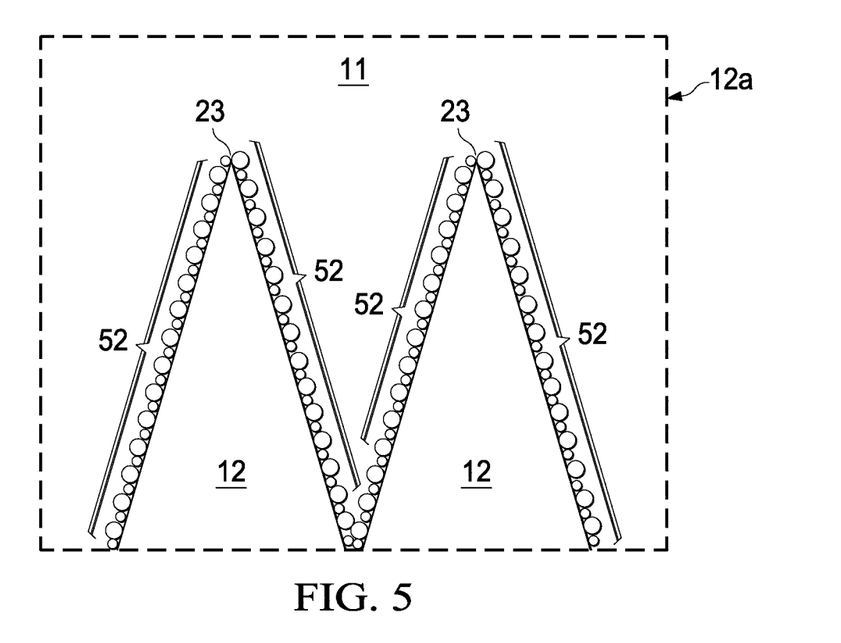
FIG. 5 shows a cross-section of the razor blade flanks of FIG. 4 after a second precursor forms a monolayer of material on the razor blade flanks.

The second deposition precursor 42 or the $H_2O$ gas in the chamber 11 then reacts with the $ZrCl_4$ layer 32 to produce a first monolayer 52 of material, in this example, Zirconium Oxide or $ZrO_2$ as shown in FIG. 5. The first monolayer 52 of $ZrO_2$ material will desirably not be an adsorbed layer as was adsorbed layer 32 of $ZrCl_4$ material. The first monolayer 52 may range in thickness from about 0.1 nm to about 0.3 nm. As shown in FIG. 5, first monolayer 52 may have substantially a uniform thickness.

Effectively, the adsorbed layer 32 has contributed to the formation of the first monolayer 52 of $ZrO_2$ material during the first ALD process cycle. Since only one monolayer (e.g., $ZrO_2$) is produced at a time when using the ALD process, by repeating the process described above as many times as needed, a desired coating or film thickness may be achieved. In this way, a second monolayer 52' is generally formed on top of the first monolayer 52, a third monolayer 52" is formed on top of the second monolayer 52', (e.g., providing a nested layering of monolayers) and so on until the desired coating or thickness is achieved. Thus, it can be appreciated that any number of additional monolayers of material may be deposited on top of the first monolayer 52 to form a desirable final coating or film 62, as shown in FIG. 6.

Chamber 11 is desirably purged of remaining gases (through output valve 14 and via output vacuum pump 13) before each such ALD process or cycle is repeated.

Figure 6:
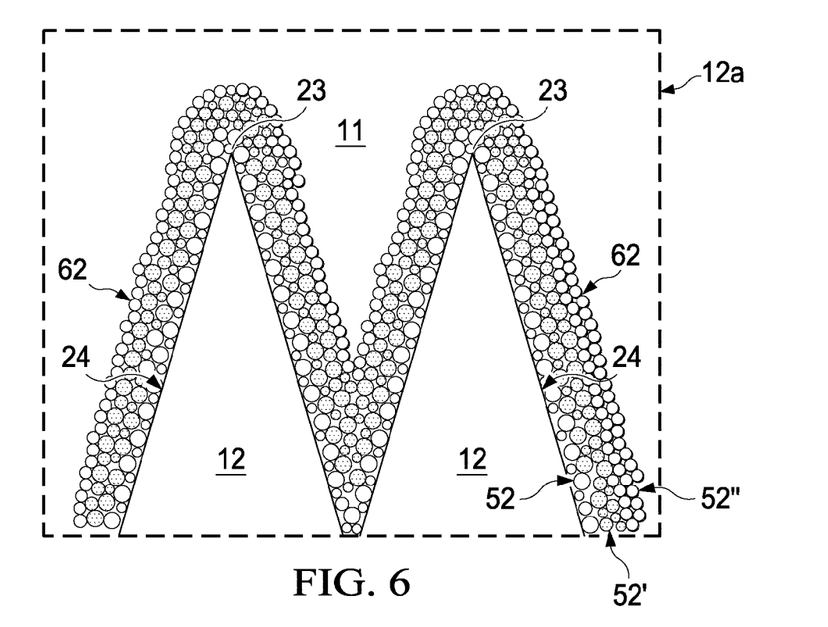
FIG. 6 shows a cross-section of razor blade flanks after the ALD process of FIGS. 1-5 is repeated many times, forming a final coating of material on the razor blade flanks.

For ease of illustration, FIG. 6 depicts just about three (3) monolayers 52 deposited onto blade flank 24 producing a coating 62, having repeated the process described above in conjunction with FIGS. 1-5 about three times. Thus, the thickness of coating 62 in FIG. 6 may be approximated at being less than about three times the thickness of each individual monolayer 52, 52', and 52". It should be appreciated that though the thickness of coating 62 may be approximated to be about the summation of thicknesses of each individual monolayer 52, 52', and 52", because of the closest-packed nature of the individually layered monolayers, the thickness of coating 62 may be less than about a linear multiple of the thicknesses of each individual monolayer 52, 52', and 52".

The number of times or cycles ALD is repeated may generally depend on the nature of the material being deposited (e.g., atomic size) and the final coating thickness desired. The thickness of a desired final coating may desirably range from about 5 nm to about 500 nm. In instances where a thicker coating is desired (e.g., up to about 2000 nm) more ALD cycles are repeated. In instances where a thinner homogeneous coating is desired (e.g., below 2 nm), fewer ALD cycles are repeated. The ALD process is thus necessarily repeated more than three times to obtain the desired thickness for the nature and type of material being used. For instance, in the present invention the ALD process may be repeated on the order of about 50 to about 5000 times and thus there may be about 50 to about 5000 individual monolayers deposited forming a final coating. For instance, one could easily extrapolate that the final coating 62 shown in FIG. 6 may be the desired final coating (in terms of thickness and other qualities) and assumed for illustrative purposes to have been formed after about 1000 ALD process repetitions or cycles for a thickness of about 100 nm.

Thus the final coating in FIG. 6 desirably is a conformal coating having been formed via an ALD process which utilizes gaseous chemistry capable of fully covering components such as razor blades on all surfaces. In addition, the final coating as shown in FIG. 6 will desirably have substantially zero porosity and substantially no film columnar growth (e.g., dense). The final coating 62 will also desirably be uniform in that it will generally have the same character and thickness throughout the deposited area and moreover will have a smooth and even surface morphology after the ALD process is completed. These coating qualities are greatly improved from the coating qualities of the prior art processes mentioned above.

In addition, after the ALD process is complete, though the thickness of coating 62 is desirably uniform throughout all areas of the blade, in some instances, the blade tip radius 63 (shown in FIG. 7) of coating 62 may fall in the range from about 80 nm to about 300 nm. In turn, these ALD coated blades may potentially have relatively high wool felt cutter forces (e.g., 2 to 3 lbs.) and thus, not be as desirable since as mentioned in the Background of the Invention section, with high wool felt cutter forces, the blade edge may be less shave-able. A blade edge that can shave hair desirably needs to have a wool felt cutter force (e.g., L5) of less than about 1.6 lbs.

To assist in reducing the wool felt cutter force if necessary, etching or desirably directional etching of the coating, either after the ALD process is complete or at intervals during the ALD process and/or after the ALD process is complete, may be provided in accordance with another aspect of the present invention. Etching in the present invention signifies the ability to selectively remove certain areas of the deposited coating, effectively making it thinner.

It should be noted that ALD deposition in the prior art involves no etching of the film or substrate as this would prevent film growth and there would be no competing reaction pathways. In the present invention, etching of the ALD deposited layers is desirable in many instances, specifically for minimizing the film growth (e.g., shaping the coating in the blade edge area to improve the blade tip radius).

Directional etching signifies that the direction or angle in which the etching is occurring may be controlled during the etching process. An etching process to reduce the wool felt cutter force may be tailored to be performed on the coating in the blade edge area or blade tip area or the blade flank; however, the present invention contemplates the etching of the coating on the blade body as well, as described in conjunction below with FIG. 11.

The directional etching may desirably occur via an ion etching process performed "in-situ" where the blades are not required to be repositioned or otherwise moved in the chamber 11. Ion etching of the present invention may desirably be undertaken using a radio frequency source at about 1.5 kW power with vacuum conditions of about 10 mTorr in Argon gas in conjunction with an instrument such as the Veeco 3 cm gridded DC (CSC) Ion Source.

Figure 7:
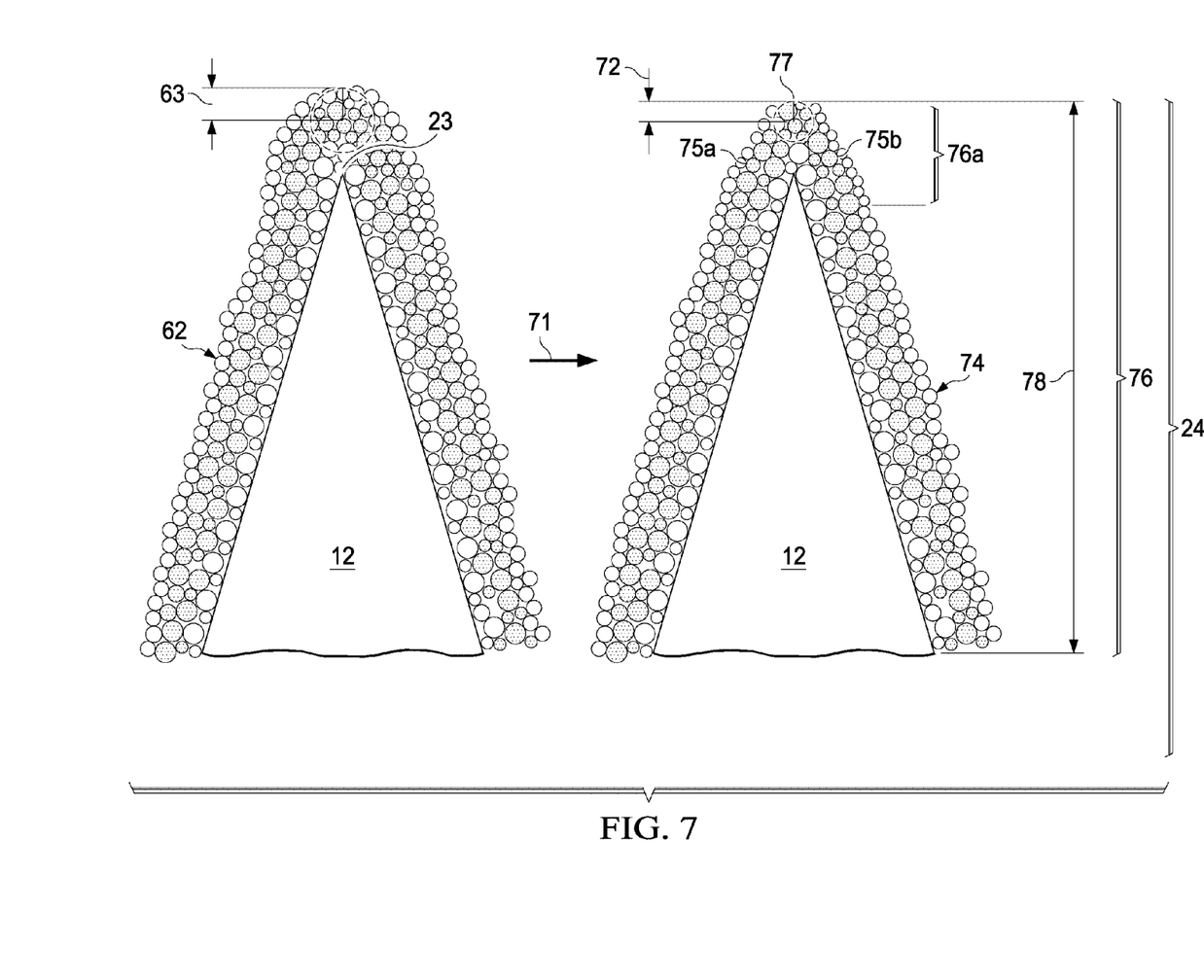
FIG. 7 shows a cross-section of razor blade flanks before and after an in-situ ion etching process is performed on the coating of FIG. 6 in accordance with the present invention.

As shown in FIG. 7, in one aspect of the present invention, an ion etch process step 71 may be performed following the ALD process of FIGS. 1-6, after which the coating 62 around the blade tip 23 area may be shaped so as to reduce the blade tip radius 63 to provide an improved blade tip radius 72 after etching coating 74 in upper portion 76a (e.g., the blade tip area). As depicted in FIG. 7, two bevels 75a and 75b are formed on either side of the blade tip 77 after the etching is completed. These bevels 75a and 75b fall within the upper portion 76a of a blade flank section 76 which has a blade flank length 78 as shown in FIG. 7. Blade flank length 78 may range from about 100 nm or 0.1 microns (e.g., T.1) from the ultimate tip 77 of the blade 12 as depicted in FIG. 7. The total blade flank section 24 (partially shown) of a blade typically extends beyond the length 78 shown in FIG. 7 and may range from about 150 microns to about 350 microns. Thus, though in this example the area where the etching is taking place is near the blade tip 77, there may desirably be one or more additional bevels in the razor blade's total blade flank section 24, and thus some of the bevels which are not shown may be disposed beyond length 78 (e.g., greater than 100 nm from the ultimate tip 77) and may be etched if desired as well.

It is noted that etching or anisotropic etching is by its nature angular dependent and thus, the etching generally occurs at different rates when at different angles. Typically, the rate of etching may be faster at the tip and slower at the flanks thereby assisting in the shaping of an optimal sharp edge.

Etching may occur more slowly typically with a smaller angle and faster with a bigger angle.

As mentioned above with regard to FIG. 6, the blade tip radius 63 may fall in the range from about 80 nm to about 300 nm. The blade tip radius 72 of FIG. 7 (after both etch process step 71 and ALD processes are complete) may range from about 15 nm to about 40 nm and desirably about 20 nm. Therefore, the reduction in amount from blade tip radius 63 to blade tip radius 72 after etching may be at least about 10%. After completion of the etching process, the wool felt cutter force of etched coating 74 may thus also be further reduced to desirably about 1.0 lbs. to about 1.5 lbs. within the optimal range for a shave-able blade edge. It should be noted that the etching process does not generally affect the uniformity and denseness of the ALD coating produced.

As mentioned above, the etching process of the present invention may be accomplished subsequent to the ALD process and/or at one or more intervals during the ALD process as desired to shape the blade tip coating and achieve the desired blade tip radius. If the etching is performed at one or more intervals of the ALD process, the ALD process is generally stopped to perform the etching. This is in contrast to many of the prior art deposition processes which are capable of etching simultaneous with the deposition as mentioned above.

Other methods of etching producing similar improvements and further contemplated in the present invention include, but are not limited to, light-based (e.g., laser) etching, RF etching, plasma etching, chemical etching or any combination thereof.

The total time it takes to deposit a final coating 62 using an ALD process on blades in the present invention as described above with regard to FIGS. 1-6, may range from about 1 minute to about 10 hours and desirably about 6 to 15 minutes. The time it takes to perform the additional in-situ ion-etching process (if performed after deposition of a final coating with ALD) on blades in the present invention, may range from about 2 minutes to about 60 minutes and desirably about 20 to 30 minutes.

In another illustrative example of the above-described embodiment of the present invention, a first deposition precursor may be Hafnium Chloride to form an adsorbed layer of $HfCl_4$ on the blade flanks and a second deposition precursor may be water vapor to produce one monolayer coating of Hafnium Oxide or $HfO_2$. As above, the process of depositing an adsorbed $HfCl_4$ layer to form a first Hafnium Oxide or $HfO_2$ monolayer coating may be repeated as many times as needed to produce multiple $HfO_2$ monolayers having a desired film thickness. Generally, as above, the chamber 11 is desirably purged of remaining gases (through valve 14 and via vacuum pump 13) before each such cycle is repeated. Thus, any number of additional $HfO_2$ monolayers of material may be deposited on top of the initial $HfO_2$ monolayer to form a final coating having desirable characteristics (e.g., thickness, density, uniformity) as described above in conjunction with FIG. 6. Similarly, as above described with FIG. 7, an in-situ ion etching process may be undertaken during or after an $HfO_2$ final coating is produced to reduce the blade tip radius, if necessary.

Figure 8:
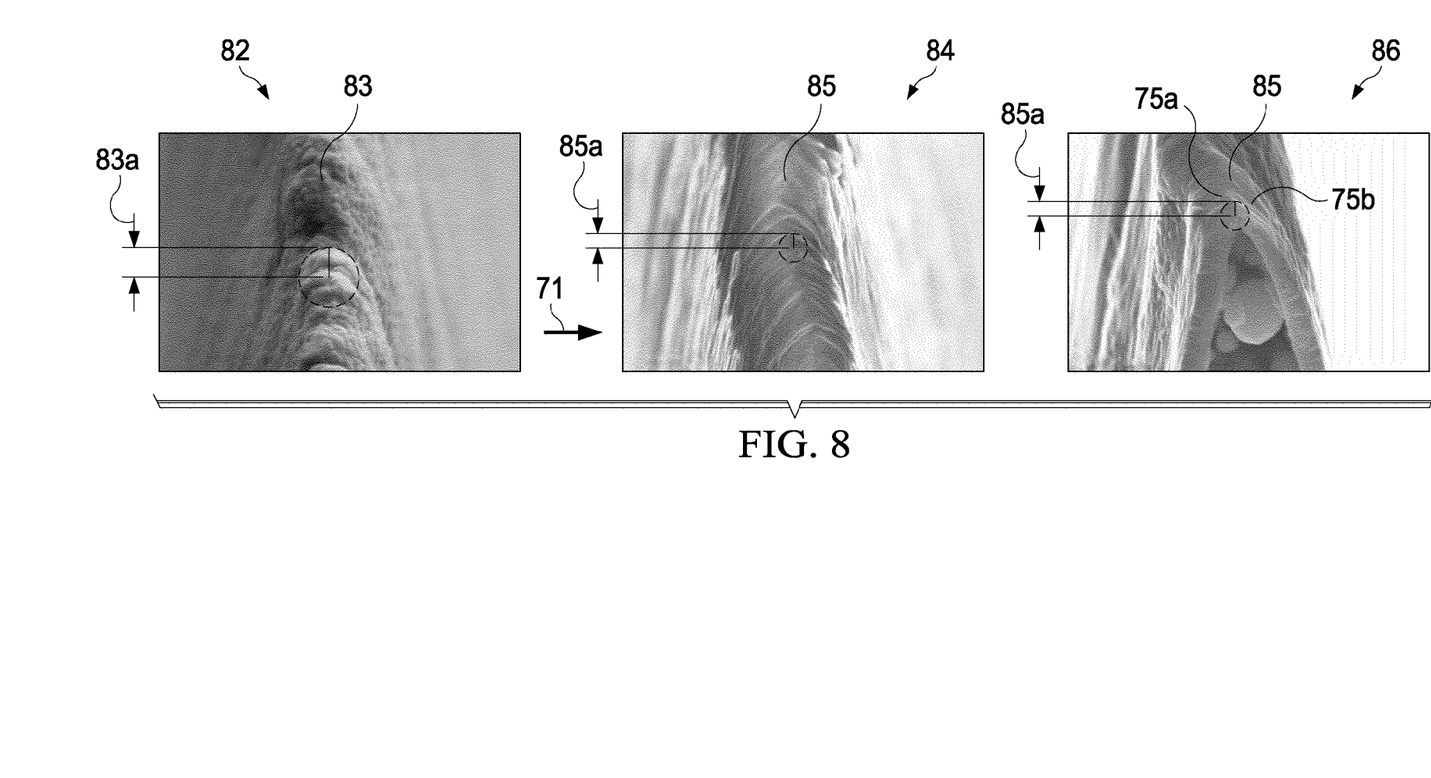
FIG. 8 shows Scanning Electron Microscope (SEM) photographs of the ALD-coated blade tip and bevel areas before and after etching in accordance with the present invention.

FIG. 8 illustrates a comparison of actual scanning electron microscope (SEM) photographs taken of blade tips after an ALD deposition of Hafnium Oxide coating, with and without etching. As shown, SEM photograph 82 depicts a coated (non-etched) blade tip 83 after using an ALD process without etching. SEM photographs 84 and 86 depict the ALD-coated blade tip 83 of photograph 82 having in-situ ion-etching performed in accordance with the present invention thereby producing an improved blade tip 85 with an etched coating. SEM photograph 86 depicts a cross-section of photograph 84 with the blade tip 85 after etching. The improvements in the blade tip radius and uniformity and other characteristics of the etched blade tip 85 after ALD process versus the non-etched ALD coating of blade tip 83 may be visible with the naked eye when comparing the photographs. The blade tip radius 83a of blade tip 83 may fall in the range from about 80 nm to about 300 nm. The blade tip radius 85a of blade tip 85 (after both ALD and etching processes are complete) may range from about 15 nm to about 40 nm and desirably about 20 nm. Therefore, the reduction from the blade tip radius 83a of blade tip 83 to the blade tip radius 85a of blade tip 85 after etching may be at least about 10% and desirably at least about 50%. After completion of the etching process, the wool felt cutter force of etched coated blade tip 85 versus blade tip 83 may be further reduced to desirably about 1.0 lbs. to about 1.5 lbs. (within the optimal range for a shave-able blade).

It can be seen that there are many advantages of applying the ALD process or the ALD process with etching (ALD/etch) to razor blade substrates over prior art processes. One major advantage is that at no point in the ALD or ALD/etch process is there a rotation or planetation of the razor blades in the vacuum chamber. ALD or ALD/etch processes produce a conformal coating covering all areas of the blade substrate which includes all exposed surfaces of the blade body 21 and blade flanks 24 and not just a portion of the blade flank as in the prior art processes. Thus, ALD or ALD/etch processes allows for a whole family of coatings to be produced that is dependent on gaseous chemistry and not the ability to reach a physical target as in the case of the prior art processes such as PVD. In this way, ALD is potentially a lower cost process than traditional PVD processes.

A further advantage is that the resulting coating is dense, both because it is applied using an atomic layering process, which requires the deposition of one monolayer at a time, and because each subsequent atomic layer is nested or closely packed with the previous atomic layer, providing a coating with substantially zero porosity. It is generally known that the denser a coating, the better its wear over time versus less dense coatings such as those in the prior art. The ALD-produced coating is generally denser than prior art coatings. Conceivably, the ALD-produced coating may at least be about 5% more dense than the prior art coatings, and desirably greater than about 10% more dense.

As blades in the current art develop towards ever increasing slimness, the need for making certain a strong edge area is achieved despite this slimness becomes magnified. The ALD process provides a razor blade with a film or coating having a conformal nature thereby allowing the entire blade surface (blade flanks and blade body) to be uniformly and densely coated. This increased uniformity and denseness, particularly in the blade flank area, produces a stronger, harder coating which in turn assists in providing an improved strong, hard blade edge area (or body).

In effect, the ALD process may provide a means for providing strength to blades or blade edges (or flanks) over the prior art. Stated otherwise by example: if one compares a "thin" 200 nm thick prior art coating (e.g., produced with PVD techniques mentioned above) it likely will not be as strong or as hard as a "thin" 200 nm thick ALD-produced coating since, while the ALD-produced coating is the same thickness as the prior art coating, the ALD-produced coating will plausibly be more dense and more uniform than the prior art coating.

Thus, conceivably, an even thinner ALD-produced coating (e.g., 100 nm) may produce the same strength and hardness qualities as that of the thicker prior art (e.g., 200 nm) coating. This indicates that it may be desirable to use ALD deposition processes for coatings to reduce deposition time and costs and increase efficiencies during manufacturing.

Thus, it follows that a chief advantage of an ALD process may plausibly be that a thinner ALD coating may be deposited on the blade or blade flank to obtain a comparable level of strength and hardness as a thicker coating deposited using prior art processes (such as PVD).

Figure 9:
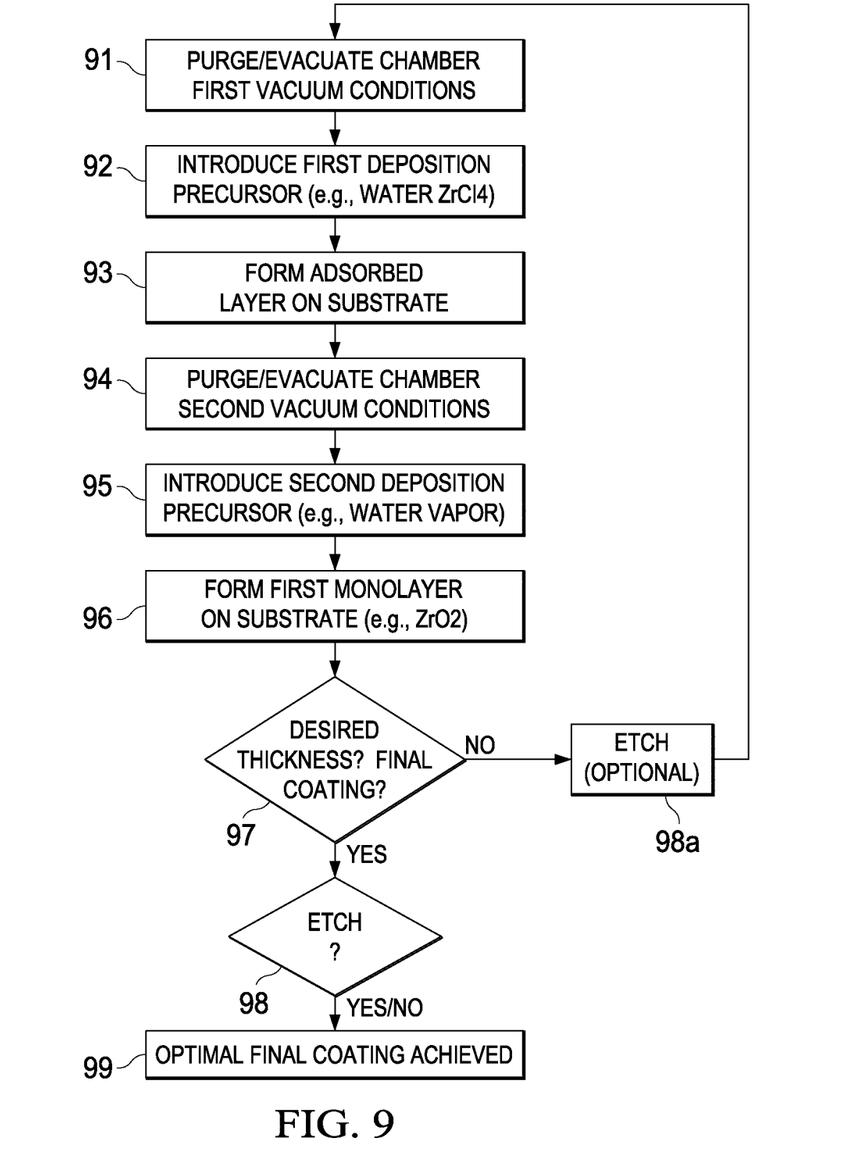
FIG. 9 is a flow diagram of the processes of the present invention.

The basic process of the present invention is depicted in a flow diagram shown in FIG. 9. At step 91, the vacuum chamber is purged and evacuated to provide first vacuum conditions, followed by the introduction of the first deposition precursor at step 92 which forms an adsorbed layer at step 93. At step 94, the vacuum chamber is purged and evacuated again to set-up second vacuum conditions, followed by the introduction of the second deposition precursor at step 95 which forms a first monolayer at step 96. At step 97, if a desired thickness of the monolayer has not been achieved, the process steps 91-96 are repeated; if a desired thickness of the monolayer has been achieved, the etching process (e.g., in-situ ion etching) at step 98 is performed, if necessary to improve the coating around the blade tip. Step 98a indicates that the etching process may also be performed in between repeated cycles if intermediate or interlayer etching is desired. A final coating which may or may not be etched is achieved at step 99.

In another aspect of the present invention, it is contemplated that any type of material may be introduced for use as a first deposition and any type of material may be introduced for use as a second deposition precursor.

For instance, other chemical compounds that may be used in addition to the examples of precursors detailed above such as Titanium Chloride or Aluminum Chloride. Common desirable characteristics when choosing a first deposition precursor chemical compound in the present invention are that the precursor has a generally high dielectric constant and thermal stability, that there is no self-decomposition or dissolution into the film or the substrate.

With regard to second deposition precursors, a final coating 62 that will include oxygen may necessarily need an oxygen source. Thus, any compound with an oxygen source may be suitable, such as water vapor as described above. However, a potential disadvantage of using water vapor as the oxygen source may be that the purge time needed to sufficiently remove the water vapor from the chamber may be long, and long purge times generally result in low throughput (e.g., number of blades coated per hour) and in turn, higher cost. In lieu of using water vapor as a second deposition precursor, any other chemical compounds may be used as an oxygen source. One other oxygen-source compounds contemplated in the present invention is ozone ($O_3$).

The formation of a super-lattice coating or a multilayer coating with mixed layers of final coatings or possibly different types of monolayers is contemplated in the present invention where coatings of different materials are layered on top of each other. The number of different types of coating materials and the number of layers may be chosen as desired and these super-lattice coatings may provide coatings with beneficial hardness and density.

In yet another aspect of the invention, the razor blade substrate may include blades which are comprised of steel with or without a top layer coating of, but not limited to, the following: Chromium (Cr), Diamond-like Carbon (DLC), Amorphous Diamond, Chromium/Platinum (Cr/Pt), Titanium (Ti), Titanium Nitride (Ti/N) or Niobium (Nb) or any combination thereof.

In addition, the razor blade substrate may be comprised of an interlayer which may be of any type such as, but not limited to, Aluminum (Al), Titanium (Ti), Nickel (Ni), Copper (Cu), Zirconium (Zr), Niobium (Nb), Molybdenum (Mo), Palladium (Pd), Hafnium (Hf), Tantalum (Ta), Chromium (Cr), Tungsten (W), Diamond-like Carbon (DLC), or any combination thereof.

In yet another aspect of the invention, the substrate may be modified prior to the initiation of the ALD process. For instance, the substrate of the razor blade may be modified to provide better adhesion of the chemical compounds to the substrate. The substrate (e.g., blade body and/or flank) may be initially cleaned in a UV ozone, RF or DC plasma environment for about 5 to about 15 minutes to improve the adhesion of the precursors and thus the final coating.

In contrast to the prior art PVD processes, the ALD process of the present invention is, as mentioned above, by default applied to the entire blade body (e.g., not just the blade flank), and thus the ALD process may have further applications for both the razor blade flank and the razor blade body.

For instance, one may desirably provide a wide range of colors, text, graphics, or other indicia or characteristics or any combination thereof on the blade flank or blade body.

Figure 10:
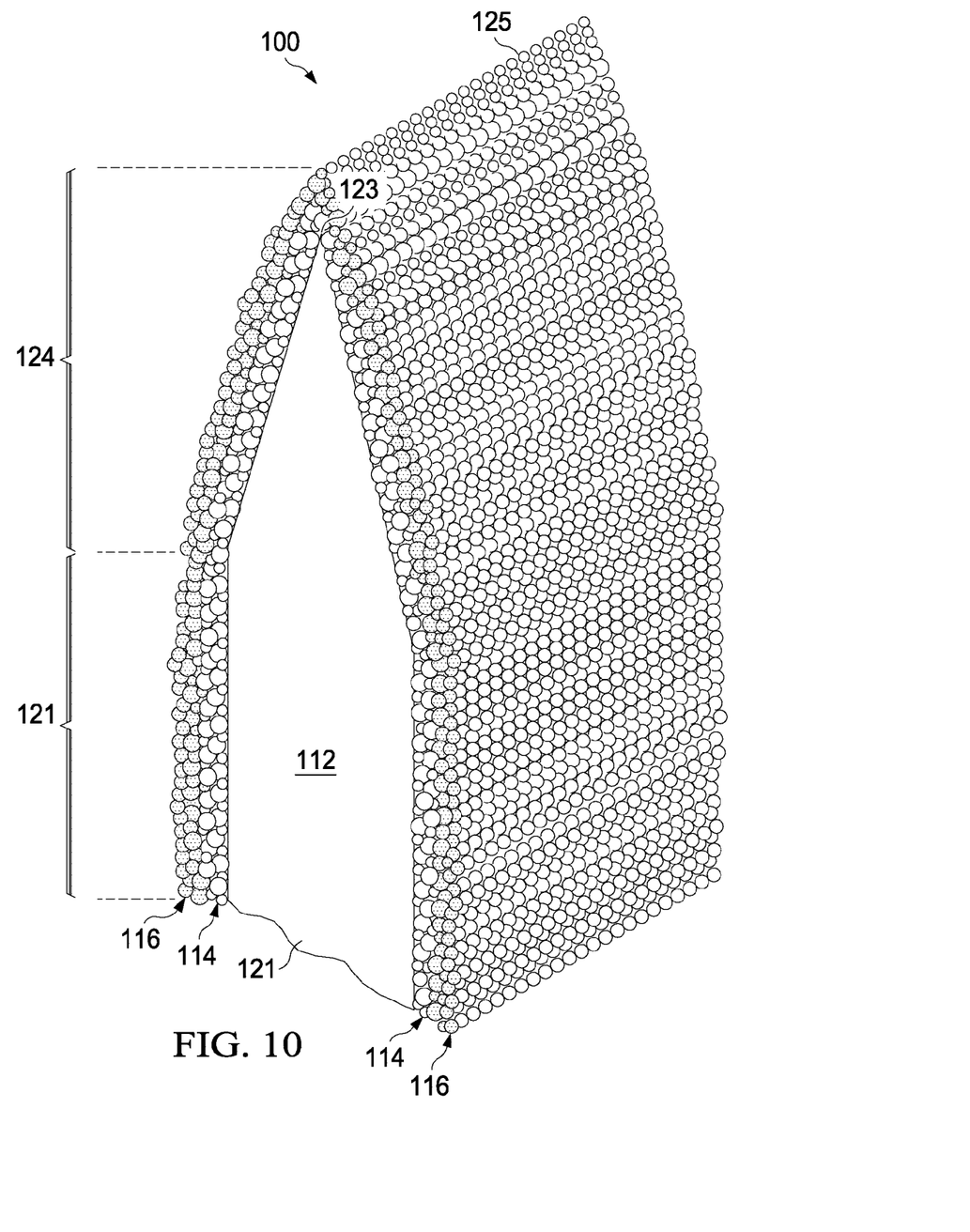
FIG. 10 shows a razor blade (flanks and body) having two coatings of contrasting characteristics (e.g., colors) deposited using ALD processes in accordance with the present invention.

In one illustrative embodiment, razor blade 100 as shown in FIG. 10, a first or lower coating 114 of the razor blade 112 having flank 124, tip 123, edge 125 and body 121 may be formed using ALD process having a certain characteristic or color (e.g., blue) and a second or upper coating 116 may be formed on a top surface of lower coating 114 having another characteristic or color (e.g., green) such that with usage, the upper coating 116 of brown/gold color wears off revealing the lower coating 114 of blue color. It should be noted that the final coating HfO2 described herein may provide a blue color and that a coating of TiO2 may provide a brown/gold to red color. Thus, potentially an indication that a blade is no longer safe to use may be provided to the user if the colors were transitioning from green to red (e.g., similar to a traffic light). Many titanium materials may provide colors. However, any types of materials that may provide varying characteristics or colors or any number of coatings are contemplated in the present invention and a further description of materials used for color coating of razor blades may be found in US Patent Publication 2005/0268470A1, entitled "Colored Razor Blades," filed on Jun. 3, 2004, the aforementioned assigned to the assignee hereof.

Figure 11:
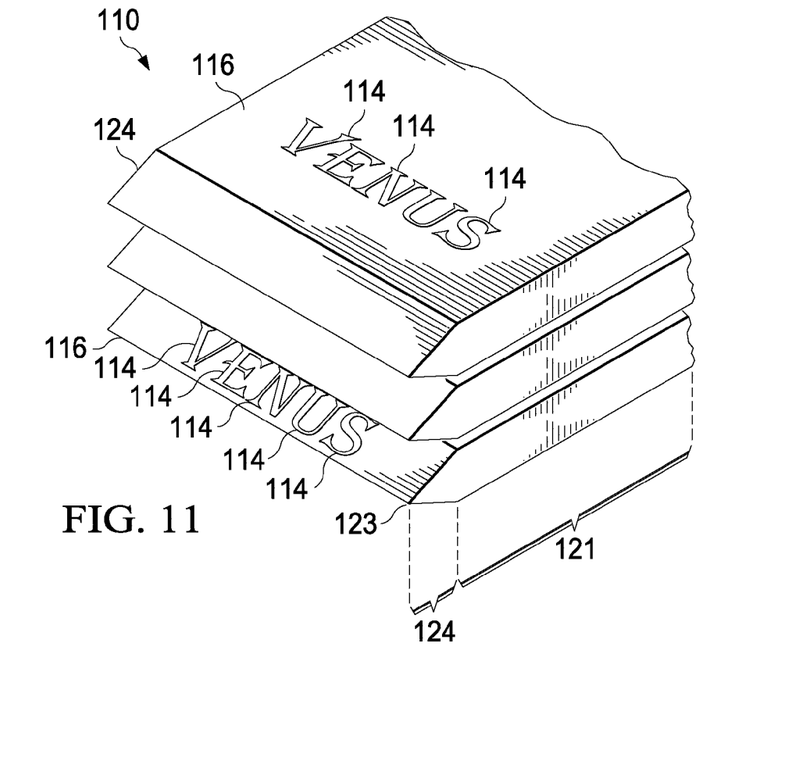
FIG. 11 shows etching of two coatings deposited using ALD processes on a blade flank and blade body in accordance with the present invention.

Furthermore, the present invention also contemplates an embodiment where razor blades 110 of FIG. 11 include blade flanks 124 having a first coating 114 with a first color (e.g., green) and a second or upper coating 116 having a second color (e.g., pink) applied via ALD processes where the second coating 116 may be subsequently etched in certain areas as shown in FIG. 11, such that the color first coating 114 is revealed in the etched out areas. In FIG. 11, the etched out areas revealing a first coating 114 on the blade flank 124 shown illustratively with letters spelling the word Venus®, a trade name. Any number of permutations of locations or different aspects or characteristics is contemplated in the present invention.

Also shown in FIG. 11, is the concept of applying coatings 114 and 116 as described above to the blade body 121 as well, using the ALD processes and then etching out areas revealing a first coating 114 on the blade flank 124 again shown illustratively with letters spelling the word Venus®, a trade name.

Any color, text, graphic, characteristics, or other indicia or any combination thereof may be deposited or etched either during or subsequent to the ALD process in the present invention.

Figure 12:
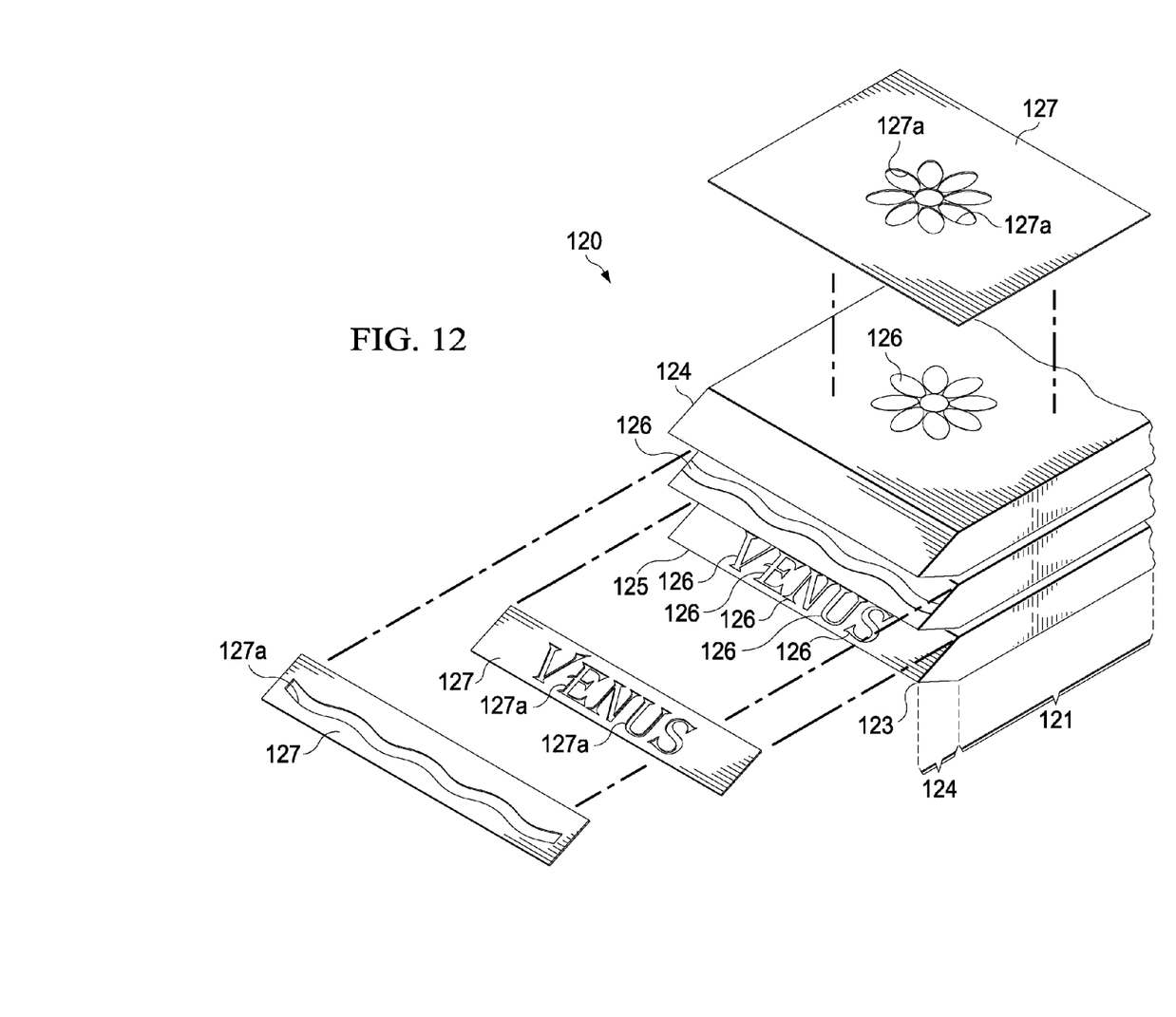
FIG. 12 shows a blade flank and body having two coatings deposited using ALD processes and stencils or masks in accordance with the present invention.

Additionally, in lieu of etching, the ALD processes described herein may also be used in conjunction with steel masks or templates (e.g., using a lithographically etched mask made of steel or glass) for placing graphics, designs, or text on a substrate. This placement may also include painting or printing (e.g., laser or ink-jet printing) the graphics, designs, or text on the substrate. As shown in FIG. 12, selected areas 126 on the razor blade body and edge may be achieved using a steel mask or stencil 127 with apertures 127a respectively placed over the selected blade areas 126 during or after the ALD process. The apertures 127a may provide as shown in FIG. 12, selected areas 126 with letters spelling the word Venus®, a trade name or flowers or other designs.

Depending on the particular mask or stencil, the selected area 126 shall represent the location where an ALD coating is deposited or alternatively where an ALD coating is not deposited depending on the desired outcome.

In this way, the ALD deposition area is selectable and any number of permutations of locations and different aspects or characteristics may be contemplated in the present invention.

Still further, the present invention is not limited to the use of the ALD process for coating razor blades. For instance, the ALD process as described herein may be used to place a material on any razor component, including but not limited to, razor cartridge clips, blade supports, bent blades or any parts of a razor handle (e.g., metal parts) or any portions thereof. Thus, any of the afore-mentioned metal razor components may be coated and etched as described in the present invention.

Yet further still, the present invention contemplates the use of the ALD process described herein for coating any type of substrate or material such as a non-metal surface or substrate including but not limited to, paper, wood, ceramic, plastic, glass, fabric in such application areas including but not limited to, home, health/medicine, beauty, feminine, baby, personal, fabric, pet, and food.

In addition to an inorganic material deposited on metal using ALD processes as described above, the present invention contemplates that any polymer or elastomer may be coated with any organic or organometallic material (e.g., an organic compound containing a metal or a metalloid linked to carbon) using the general ALD process herein described.

One example may be the application of the ALD process onto other razor components such as the razor cartridge, the cartridge connecting structure, the housing and/or elastomeric or any lubricating bodies.

For instance, the present invention contemplates that the ALD deposition may be utilized to place an organometallic or anti-microbial coating or agent such as silver or isothiazolinone which may exhibit both antifungal and antibacterial properties on an elastomeric razor handle or toothbrush and that etching may be used to create ridges or text or other aspects within or on the outer surface of the coating. It is conceivable that a fewer number of total ALD cycles may be required to achieve an anti-microbial coating if a homogeneous coating (e.g., typically less than 2 nm thickness) is desired.

The novel aspects of the present invention, therefore, plausibly apply equivalently to any substrate that is capable of being coated using ALD deposition techniques and/or etching processes. The thicknesses of these ALD-deposited may range widely from about 0.1 nm to about 2000 nm depending on desired design choice and deposition material chosen. If a monolayer of material is desired the thickness may be about 0.5 nm or if a thin layer of material is desired the thickness of such a deposited coating of layers may be about 5 nm.

In addition, with regard to razor blades, since subsequent to the ALD and etching processes, the blade flank may likely be coated with a polymeric material such as polytetrafluoroethylene or PTFE (or a form of Teflon®), oftentimes referred to as Telomer, the present invention also contemplates that the coating of the polymeric material may occur during the ALD process and/or etch process using known prior art deposition processes.

In addition, the ALD process and/or etching process of the present invention may be used before, during or after prior art film or coating deposition. For instance, the ALD and/or etching process may be used to provide one or more interlayers, underlayers or overlayers, in conjunction with prior art coatings or any combination thereof. Razor blades that have already been coated using prior art PVD processes may in turn be subsequently deposited with an overlayer using the ALD and/or ALD with etching process of the present invention to improve surface smoothness or denseness.

The dimensions and values disclosed herein are not to be understood as being strictly limited to the exact numerical values recited. Instead, unless otherwise specified, each such dimension is intended to mean both the recited value and a functionally equivalent range surrounding that value. For example, a dimension disclosed as "40 mm" is intended to mean "about 40 mm".

All documents cited in the Detailed Description of the Invention are, in relevant part, incorporated herein by reference; the citation of any document is not to be construed as an admission that it is prior art with respect to the present invention. To the extent that any meaning or definition of a term in this written document conflicts with any meaning or definition of the term in a document incorporated by reference, the meaning or definition assigned to the term in this written document shall govern.

While particular embodiments of the present invention have been illustrated and described, it would be obvious to those skilled in the art that various other changes and modifications can be made without departing from the spirit and scope of the invention. It is therefore intended to cover in the appended claims all such changes and modifications that are within the scope of this invention.

What is claimed is:

1. A method for coating a razor blade comprising:
depositing, on at least one razor blade positioned in a vacuum chamber, at least one coating of at least one material, using an atomic layer deposition (ALD) process wherein said at least one coating covers an entire surface of at least one blade flank and at least a portion of a surface of a blade body of said at least one razor blade;
etching said at least one coating.

2. The method of claim 1 wherein said etching of said coating occurs on said at least one blade flank or on said blade body or on both said blade flank and said blade body.

3. The method of claim 1 wherein said etching removes said coating to produces a blade tip radius in the range of about 15 nm to about 40 nm.

4. The method of claim 1 wherein said etching occurs during said ALD process, after said ALD process, or both during and after said ALD process.

5. The method of claim 1 wherein said etching comprises directional, in-situ ion etching, chemical etching, RF etching, plasma, light-based etching or any combination thereof.

6. The method of claim 1 wherein said coating is conformal, has a substantially uniform thickness, smooth surface morphology and substantially zero porosity.

7. The method of claim 1 wherein said coating has a thickness ranging from about 0.1 nm to about 500 nm.

8. The method of claim 1 wherein said ALD process is applied for a time ranging from about 1 minute to about 10 hours and said etching is applied for a time ranging from about 2 minutes to about 1 hour.

9. The method of claim 1 wherein said razor blade is comprised of steel, Chromium (Cr), Diamond-like Carbon (DLC), Amorphous Diamond, Chromium/Platinum (Cr/Pt), Titanium, Titanium Nitride or Niobium or any combination thereof.

10. The method of claim 1 wherein said ALD process further comprises the steps of:
 a. depositing a first monolayer of a first material onto said at least one razor blade;
 b. depositing a second monolayer of a second material onto said at least one razor blade; and
 c. repeating steps (a) and (b) until an optimal thickness of said at least one coating is produced.

11. The method of claim 10 wherein said first and second materials are the same.

12. The method of claim 10 wherein steps (a) or (b) further comprises the steps of:
 d. evacuating said vacuum chamber;
 e. introducing a first deposition precursor into said chamber to form an adsorbed layer on said at least one razor blade;
 f. purging said vacuum chamber; and
 g. introducing a second deposition precursor into said chamber to produce a monolayer of said material on said at least one razor blade.

13. The method of claim 12 where said first deposition precursor comprises Zirconium Chloride, Hafnium Chloride, Aluminum Chloride, or Titanium Chloride, or any combination thereof and said second deposition precursor comprises water vapor.

14. A method for coating a razor component comprising:
 depositing, on at least one razor component, positioned in a vacuum chamber, at least one coating of at least one material using an ALD process.

15. The method of claim 14 wherein said razor component comprises a cartridge clip or at least a portion thereof, a blade support or at least a portion thereof, a razor blade body or at least a portion thereof, a razor blade flank or at least a portion thereof, a bent blade or at least a portion thereof, a razor handle or at least a portion thereof, or any combination thereof.

16. The method of claim 14 further comprises the step of etching said at least one coating.

17. The method of claim 14 wherein said coating has a thickness ranging from about 0.1 nm to about 2000 nm.

* * * * *